(12) United States Patent
Sutardja et al.

(10) Patent No.: US 8,618,654 B2
(45) Date of Patent: Dec. 31, 2013

(54) STRUCTURES EMBEDDED WITHIN CORE MATERIAL AND METHODS OF MANUFACTURING THEREOF

(75) Inventors: Sehat Sutardja, Los Altos Hills, CA (US); Albert Wu, Palo Alto, CA (US); Scott Wu, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 130 days.

(21) Appl. No.: 13/184,304

(22) Filed: Jul. 15, 2011

(65) Prior Publication Data

US 2012/0049364 A1     Mar. 1, 2012

Related U.S. Application Data

(63) Continuation-in-part of application No. 13/049,550, filed on Mar. 16, 2011, now Pat. No. 8,338,934.

(60) Provisional application No. 61/366,136, filed on Jul. 20, 2010, provisional application No. 61/368,555, filed on Jul. 28, 2010.

(51) Int. Cl.
*H01L 23/34*     (2006.01)

(52) U.S. Cl.
USPC ..................... 257/723; 257/724; 257/725

(58) Field of Classification Search
USPC ..................................... 257/723, 724, 725
See application file for complete search history.

(56) References Cited

U.S. PATENT DOCUMENTS

| | | | |
|---|---|---|---|
| 6,344,682 B1 | 2/2002 | Tomita | |
| 6,356,453 B1 * | 3/2002 | Juskey et al. | 361/760 |
| 6,388,320 B2 * | 5/2002 | Smola et al. | 257/724 |
| 6,437,990 B1 * | 8/2002 | Degani et al. | 361/783 |
| 6,506,633 B1 * | 1/2003 | Cheng et al. | 438/126 |
| 6,583,503 B2 * | 6/2003 | Akram et al. | 257/686 |
| 6,610,560 B2 * | 8/2003 | Pu et al. | 438/122 |
| 6,770,969 B2 * | 8/2004 | Mosley | 257/724 |
| 6,833,628 B2 * | 12/2004 | Brandenburg et al. | 257/778 |
| 6,876,074 B2 * | 4/2005 | Kim | 257/686 |
| 6,943,442 B2 * | 9/2005 | Sunohara et al. | 257/700 |
| 6,960,827 B2 * | 11/2005 | Nishimura et al. | 257/723 |
| 7,189,593 B2 | 3/2007 | Lee | |
| 7,202,556 B2 | 4/2007 | Khng et al. | |
| 7,294,927 B2 * | 11/2007 | Takahashi | 257/724 |
| 7,569,918 B2 * | 8/2009 | Gerber et al. | 257/676 |
| 7,709,944 B2 * | 5/2010 | Kuan et al. | 257/686 |
| 7,714,424 B2 * | 5/2010 | Katagiri et al. | 257/686 |
| 7,843,059 B2 * | 11/2010 | Gomyo et al. | 257/723 |
| 7,872,343 B1 | 1/2011 | Berry | |
| 7,982,297 B1 * | 7/2011 | Heo | 257/686 |

(Continued)

FOREIGN PATENT DOCUMENTS

WO     WO2010057808 A1     5/2010

*Primary Examiner* — Ngan Ngo

(57) ABSTRACT

Embodiments of the present disclosure provide a method that comprises providing a first die having a surface comprising a bond pad to route electrical signals of the first die and attaching the first die to a layer of a substrate. The method further comprises forming one or more additional layers of the substrate to embed the first die in the substrate and coupling a second die to the one or more additional layers, the second die having a surface comprising a bond pad to route electrical signals of the second die. The second die is coupled to the one or more additional layers such that electrical signals are routed between the first die and the second die.

13 Claims, 15 Drawing Sheets

(56) References Cited

U.S. PATENT DOCUMENTS

| | | | |
|---|---|---|---|
| 7,994,626 B2 * | 8/2011 | Pendse | 257/686 |
| 8,217,502 B2 * | 7/2012 | Ko | 257/686 |
| 2003/0020154 A1 * | 1/2003 | Hashimoto | 257/686 |
| 2004/0113269 A1 * | 6/2004 | Wada | 257/724 |
| 2007/0018313 A1 * | 1/2007 | Gomyo et al. | 257/723 |
| 2008/0174008 A1 * | 7/2008 | Yang et al. | 257/723 |
| 2008/0224306 A1 * | 9/2008 | Yang | 257/725 |
| 2009/0057871 A1 | 3/2009 | Zhao et al. | |
| 2009/0244873 A1 | 10/2009 | Lu et al. | |
| 2010/0117212 A1 | 5/2010 | Corisis et al. | |
| 2010/0123235 A1 * | 5/2010 | Kim et al. | 257/686 |
| 2010/0133675 A1 * | 6/2010 | Yu et al. | 257/686 |
| 2010/0148316 A1 | 6/2010 | Kim et al. | |
| 2010/0207267 A1 * | 8/2010 | Lin | 257/692 |
| 2010/0224992 A1 * | 9/2010 | McConnelee et al. | 257/723 |
| 2010/0230806 A1 * | 9/2010 | Huang et al. | 257/723 |
| 2011/0018123 A1 * | 1/2011 | An et al. | 257/693 |
| 2011/0031607 A1 * | 2/2011 | Lin et al. | 257/692 |
| 2011/0068459 A1 * | 3/2011 | Pagaila et al. | 257/698 |
| 2011/0068464 A1 * | 3/2011 | Chi et al. | 257/723 |
| 2011/0147917 A1 * | 6/2011 | England et al. | 257/692 |

* cited by examiner

STRUCTURES EMBEDDED WITHIN CORE MATERIAL AND METHODS OF MANUFACTURING THEREOF

CROSS REFERENCE TO RELATED APPLICATIONS

This disclosure is a continuation-in-part to U.S. patent application Ser. No. 13/049,550, filed Mar. 16, 2011, and also claims priority to U.S. Provisional Patent Application No. 61/366,136, filed Jul. 20, 2010, and U.S. Provisional Patent Application No. 61/368,555, filed Jul. 28, 2010, the entire specifications of which are hereby incorporated by reference in their entireties for all purposes, except for those sections, if any, that are inconsistent with this specification.

TECHNICAL FIELD

Embodiments of the present disclosure relate to the field of integrated circuits, and more particularly, to techniques, structures, and configurations of structures embedded within a substrate, as well as packaging arrangements that incorporate such structures embedded within a substrate.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Typically, with many multi-chip packaging arrangements, the packaging arrangement is arranged in one of either a package-on-package (POP) arrangement, or a multi-chip module (MCM) arrangement. Both packaging arrangements are generally fairly thick with heights of up to 2.6 millimeters. Additionally, with the MCM arrangement, one of the chips within the arrangement is often an integrated circuit configured with one or more System-on-Chips (SoCs), while the other chip is often some type of memory device. Heat from the processors within the SoCs generally adversely affects the performance of the memory device.

SUMMARY in various embodiments, the present disclosure provides a method comprising providing a first die having a surface comprising a bond pad to route electrical signals of the first die and attaching the first die to a layer of a substrate. The method further comprises forming one or more additional layers of the substrate to embed the first die in the substrate and coupling a second die to the one or more additional layers, the second die having a surface comprising a bond pad to route electrical signals of the second die, The second die is coupled to the one or more additional layers such that electrical signals are routed between the first die and the second die.

The present disclosure also provides an apparatus comprising a substrate having (i) a first laminate layer, (ii) a second laminate layer, and (iii) a core material that is disposed between the first laminate layer and the second laminate layer. The apparatus also comprises a first die coupled to the first laminate layer, the first die including a surface comprising a bond pad to route electrical signals of the first die, wherein the first die is embedded in the core material of the substrate. The apparatus further comprises a second die coupled to the second laminate layer, the second die having a surface comprising a bond pad to route electrical signals of the second die. The second die is coupled to the second laminate layer such that electrical signals are routed between the first die and the second die.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Figure 1A:
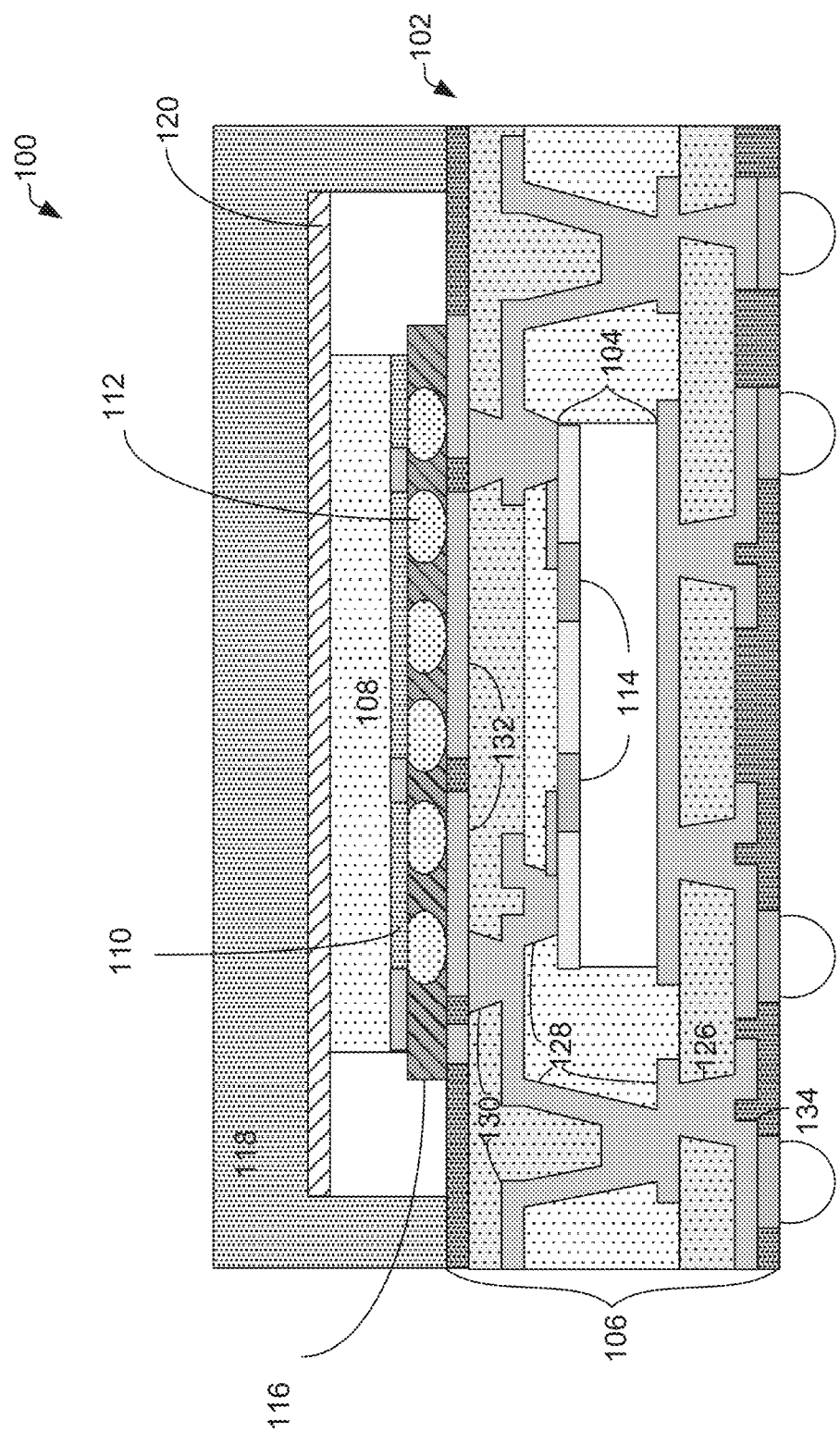
FIGS. 1A-D schematically illustrate an example packaging arrangement that includes an example die arrangement including a die embedded in a substrate.

FIG. 1A illustrates a packaging arrangement 100 that includes a die arrangement 102 having a first die 104 embedded within a substrate 106. In accordance with various embodiments, the first die 104 is a memory device and, in accordance with an embodiment, the first die 104 is a dynamic random access memory (DRAM). However, other types of memory devices may be utilized. For clarity, many of the components within die arrangement 102 are not described. The die arrangement 102 will be described in more detail herein with respect to FIGS. 4-11.

A second die 108 is coupled to the die arrangement 102. The second die 108 includes a bond pad 110. The second die 108 is coupled to the die arrangement 102 via solder balls 112 such that the bond pad 110 of the second die 108 is communicatively coupled with a bond pad 114 of the first die 104 via routing structures 128, 130 and 132. Thus, electrical signals can be routed between the first die 104 a id the second die 108. The second die 108 is also coupled to the die arrangement 102 via the solder balls 112 such that the bond pad 110 is communicatively coupled with routing structures 126 and 134 via routing structures 128, 130 and 132 to route electrical signals to devices external to packaging arrangement 100. In accordance with various embodiments, the second die 108 is configured to include one or more System-on-Chips (SoCs).

Figure 1B:
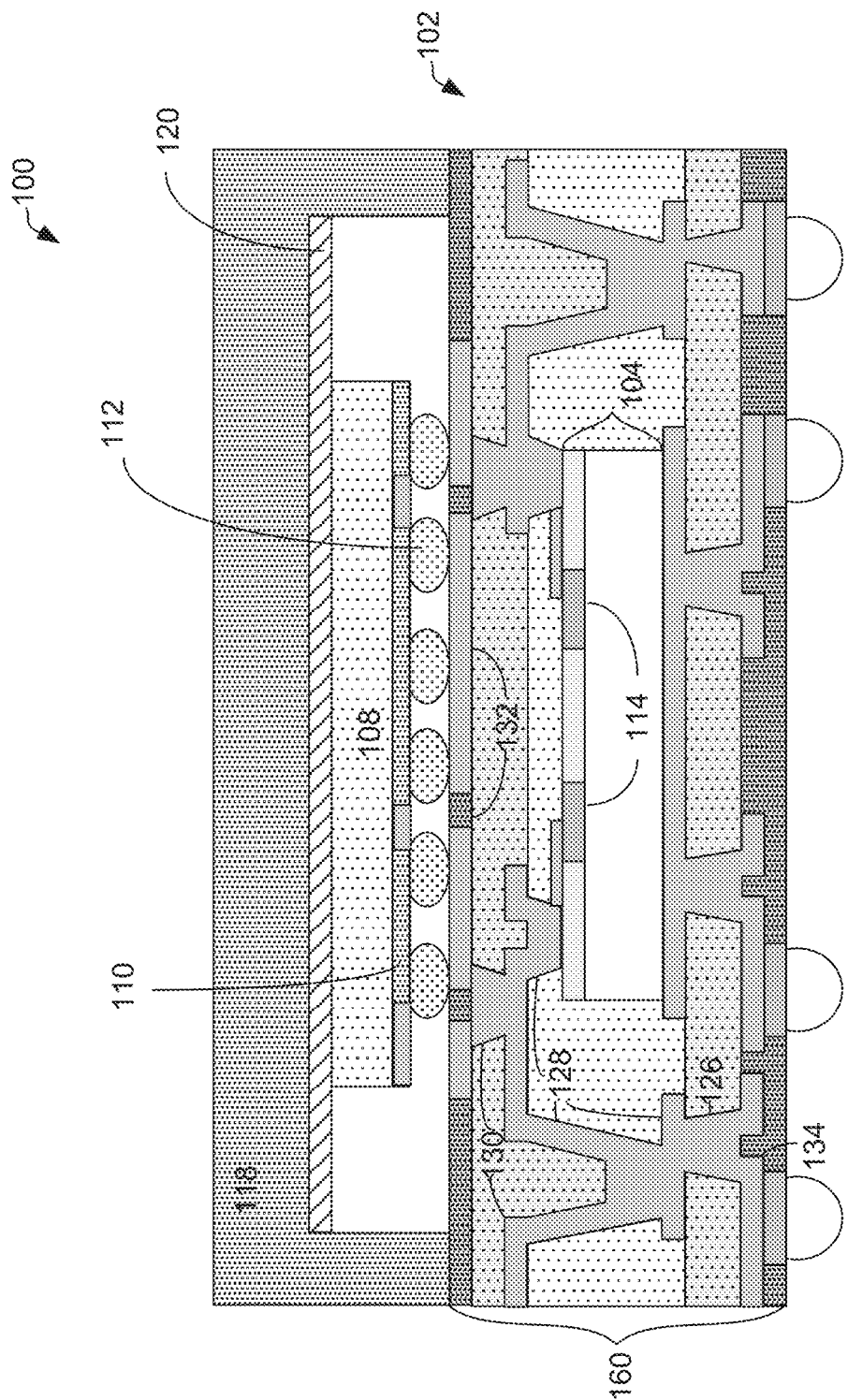

In accordance with the various embodiments, underfill material 116 is provided between the second die 108 and the die arrangement 102. The underfill material 116 provides protection of the joints formed by the solder balls 112. Referring to FIG. 1B, in accordance with various embodiments, the underfill material 116 is not included. Generally, the larger the size of the solder balls 112, the less need there is for underfill material 116.

Referring to FIGS. 1A and 1B, in accordance with various embodiments, heat sink 118 is included. The heat sink 118 can be coupled to the die arrangement 102 via a suitable adhesive such as, for example, an epoxy. Additionally, a heat transfer compound 120 is utilized to couple the heat sink 118 to the second die 108. The heat transfer compound 120 is generally a metal filled resin glue, while the heat sink 118 is generally comprised of, for example, aluminum or copper. In accordance with various embodiments, the heat sink 118 is only coupled to the second die 108 via the heat transfer compound 120 and is not coupled to the die arrangement 102.

Figure 1C:
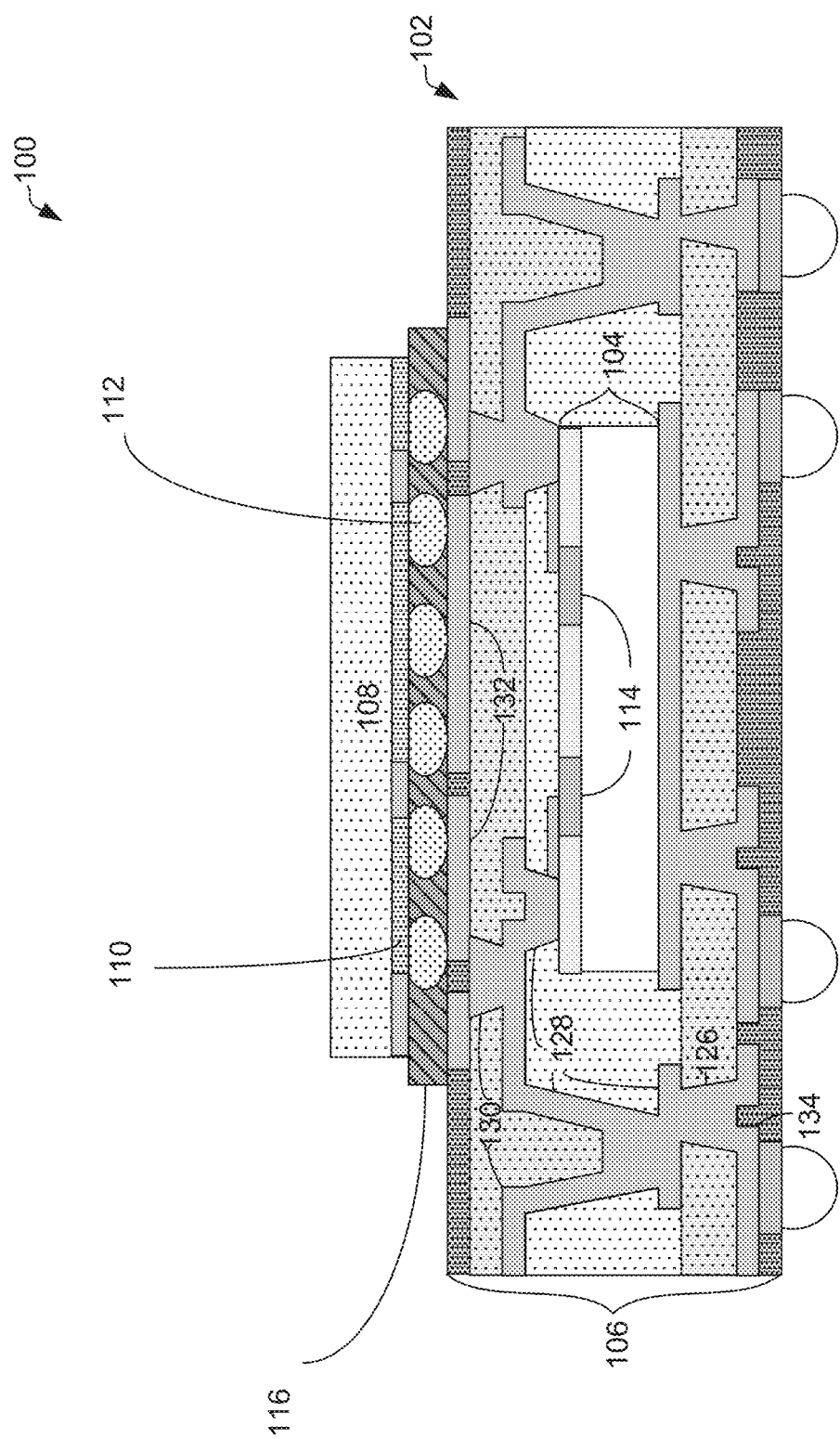
Figure 1D:
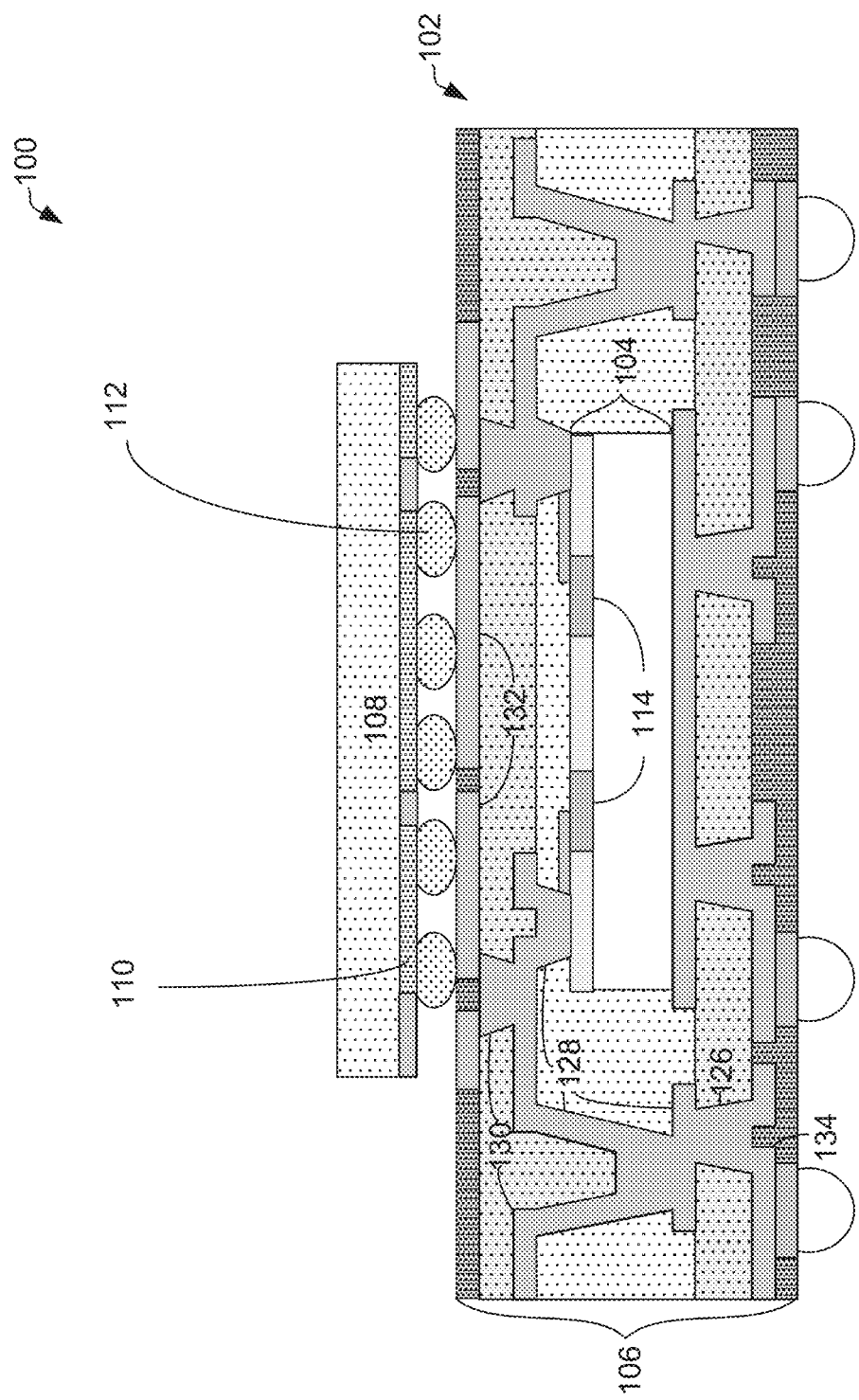

FIG. 1C illustrates an embodiment of the packaging arrangement 100 wherein the packaging arrangement 100 does not include a heat sink 118, and therefore, does not include the heat transfer compound 120. In the embodiment illustrated in FIG. 1C, underfill material 116 is included between the second die 108 and the die arrangement 102. FIG. 1D illustrates an embodiment of the packaging arrangement 100 that does not include the heat sink 118, and therefore, does not include the heat transfer compound 120, and also does not include the underfill material 116 between the second die 108 and the die arrangement 102.

Figure 2A:
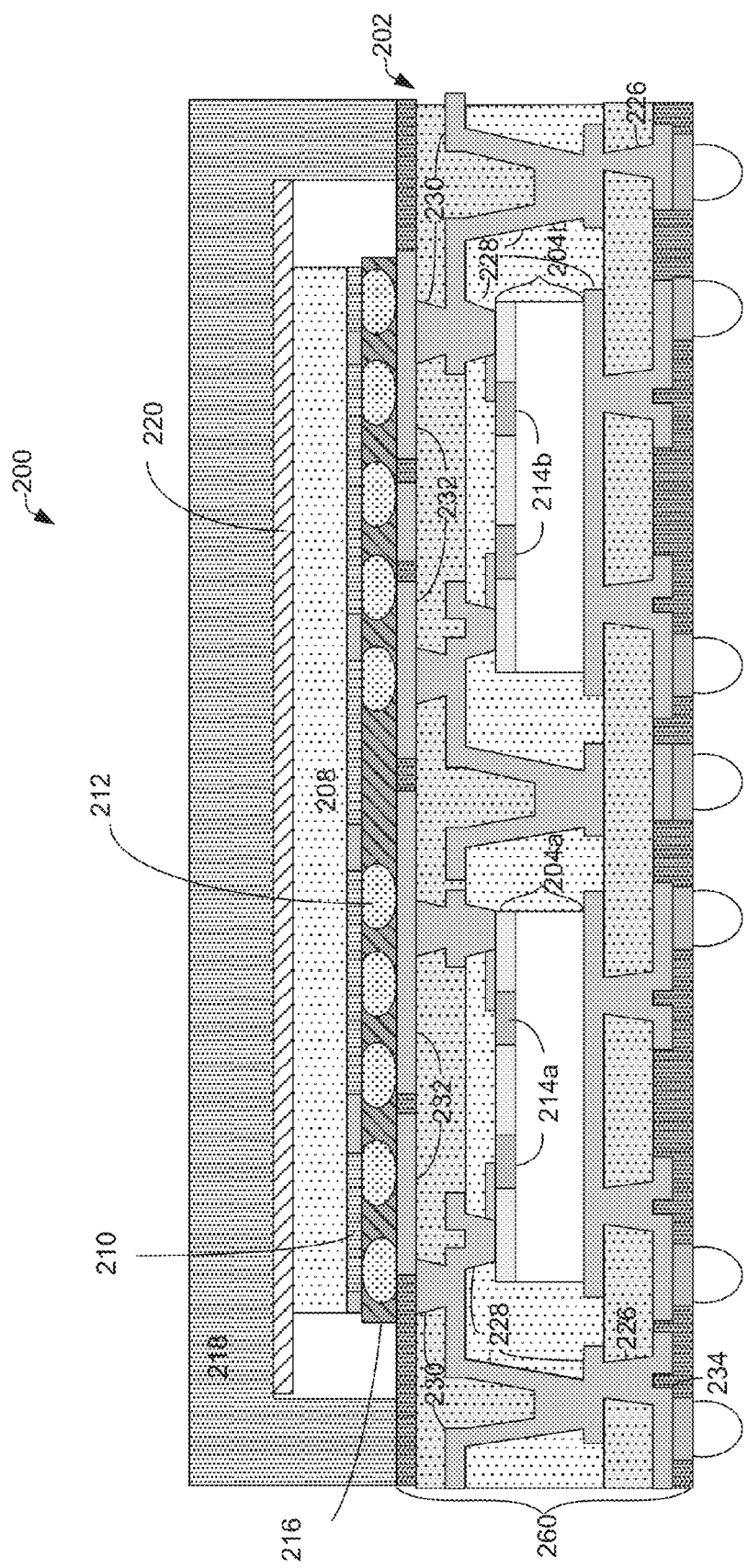
FIGS. 2A-D schematically illustrate another example packaging arrangement that includes another example die arrangement including two dies embedded in a substrate.

FIG. 2A illustrates a packaging arrangement 200 that is similar to the packaging arrangement 100. The packaging arrangement 200 includes two first dies 204a, 204b embedded within a die arrangement 202 that is similar to die arrangement 102. As can be seen in FIG. 2A, the two first dies 204a, 204b are embedded within the die arrangement 202 in a side-by-side relationship. In accordance with various embodiments, the first dies 204a, 204b are memory devices and, in accordance with an embodiment, the first dies 204a, 204b are dynamic random access memory (DRAM). However, other types of memory devices may be utilized.

Figure 2B:
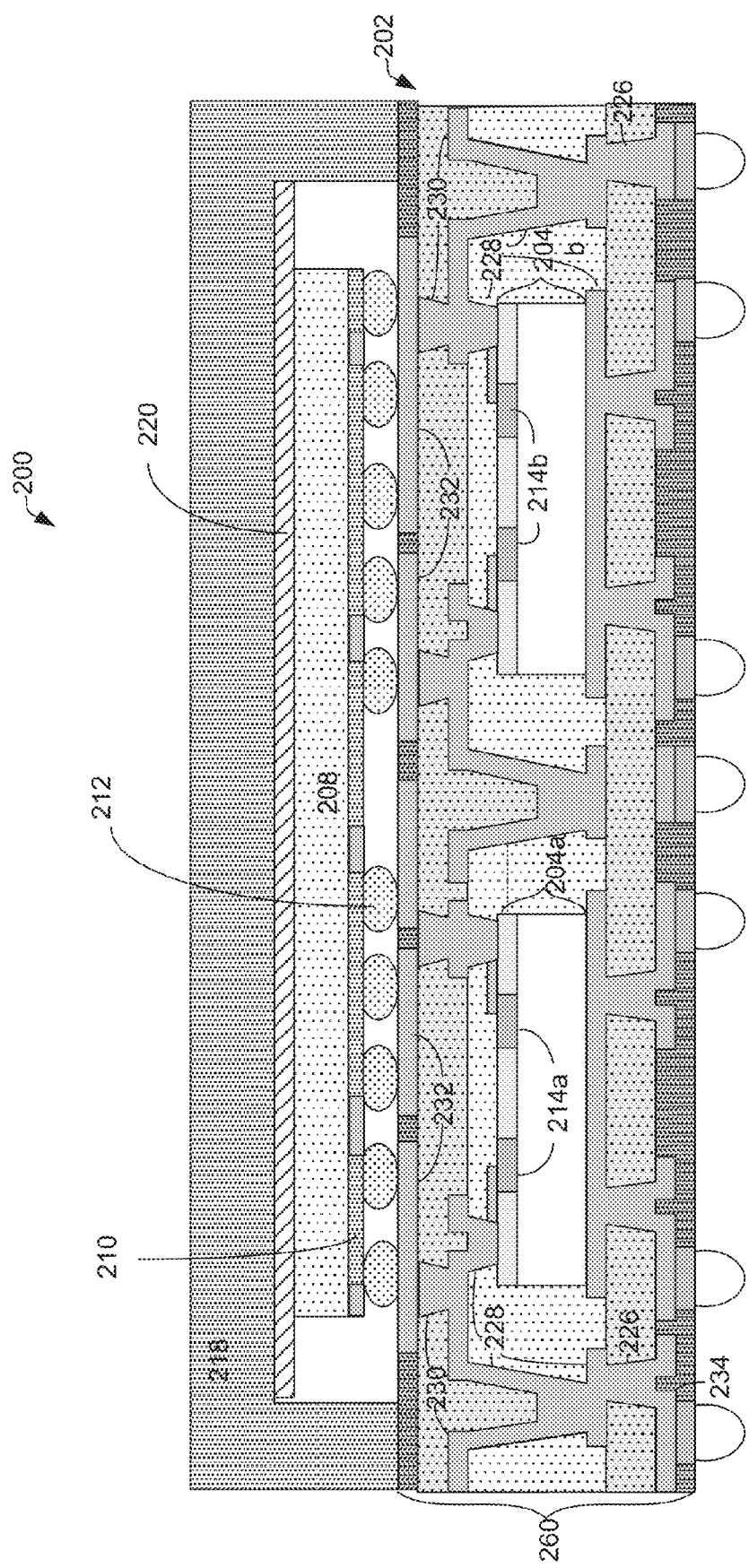

A second die 208 is coupled to the die arrangement 202. The second die 208 includes a bond pad 210. The second die 208 is coupled to the die arrangement 202 via solder balls 212 such that the bond pad 210 of the second die 208 is communicatively coupled with a bond pad 214a of the first die 204a and a bond pad 214b of the first die 204b via routing structures 228, 230 and 232. Thus, electrical signals can be routed between the first dies 204a, 204b and the second die 208. The second die 208 is also coupled to the die arrangement 202 via the solder balls 212 such that the bond pad 210 is communicatively coupled with routing structures 226 and 234 via routing structures 228, 230 and 232 to route electrical signals to devices external to packaging arrangement 200. In accordance with various embodiments, the second die 208 is configured to include one or more System-on-Chips (SoCs).

in accordance with the various embodiments, underfill material 216 is provided between the second die 208 and the die arrangement 202. The underfill material 216 provides protection of the joints formed by the solder balls 212. Referring to FIG. 2B, in accordance with various embodiments, the underfill material 216 is not included.

Referring to FIGS. 2A and 2B, in accordance with various embodiments, a heat sink 218 is included. The heat sink 218 can be coupled to the die arrangement 202 via a suitable adhesive such as, for example, an epoxy. Additionally, a heat transfer compound 220 is utilized to couple the heat sink 218 to the second die 208. The heat transfer compound 220 is generally a metal filled resin glue, while the heat sink 218 is generally comprised of, for example, aluminum or copper. In accordance with various embodiments, the heat sink 218 is only coupled to the second die 208 via the heat transfer compound 220 and is not coupled to the die arrangement 202.

Figure 2C:
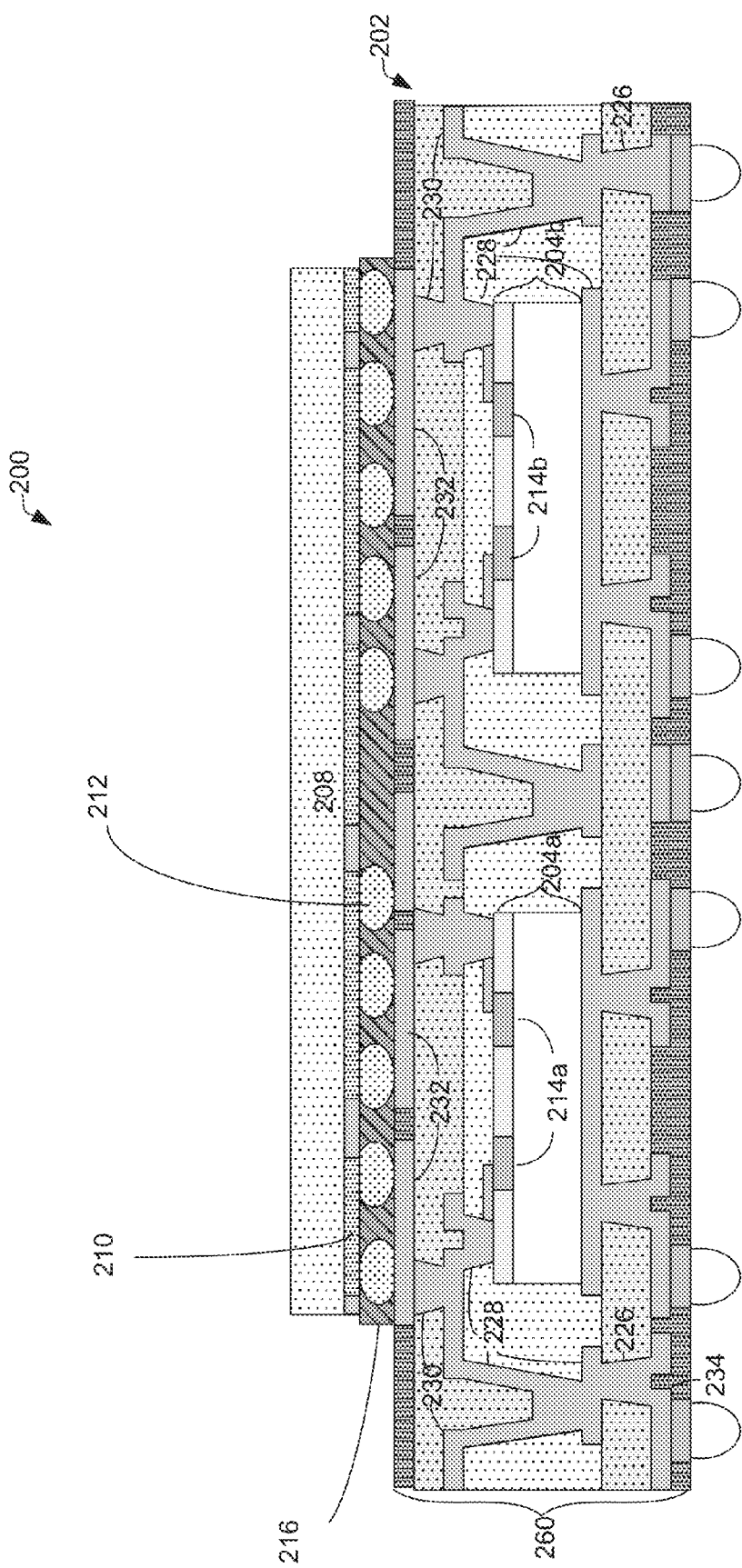
Figure 2D:
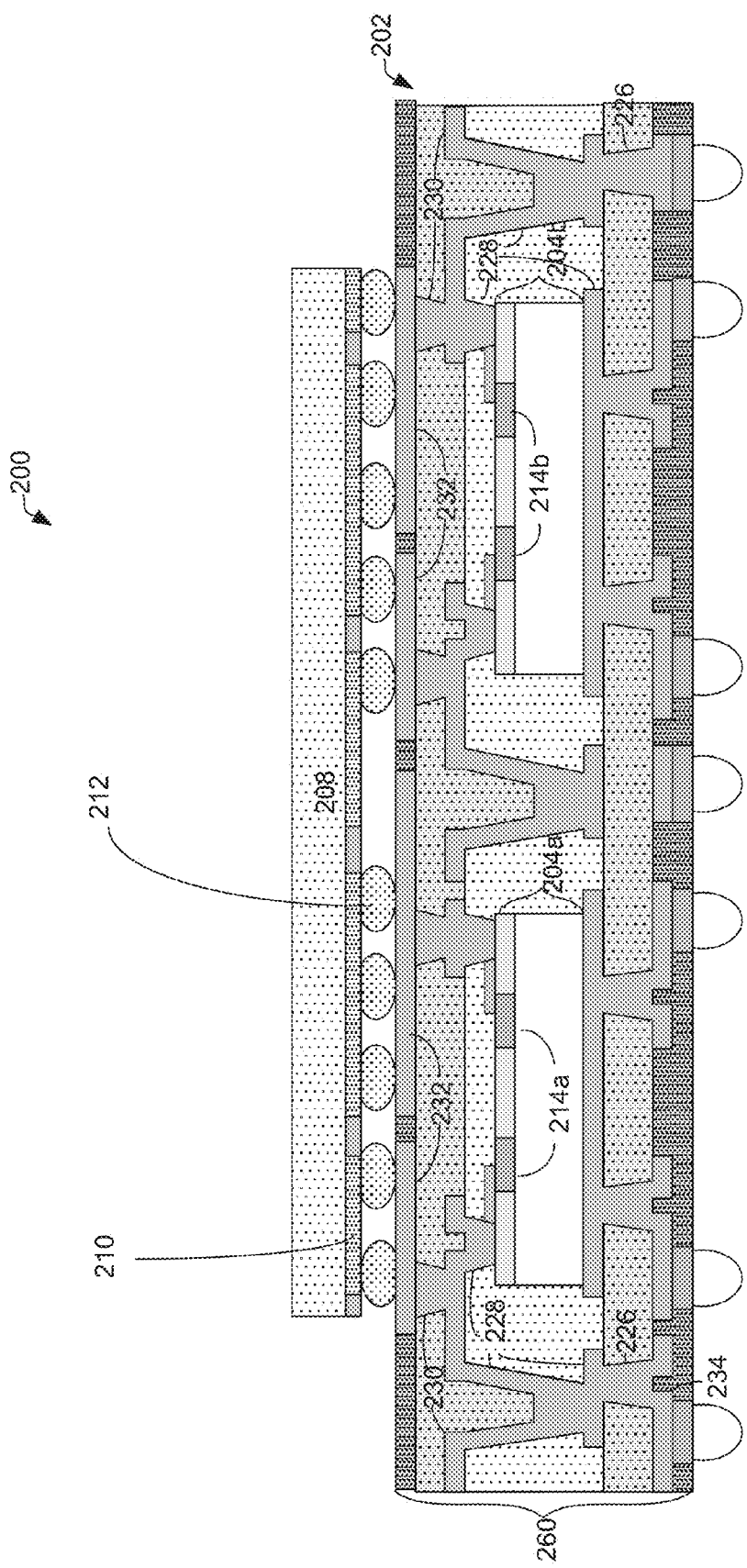

FIG. 2C illustrates an embodiment of the packaging arrangement 200 wherein the packaging arrangement 200 does not include a heat sink 218, and therefore, does not include the heat transfer compound 220. In the embodiment illustrated in FIG. 2C, underfill material 216 is included between the second die 208 and the die arrangement 202. FIG. 2D illustrates an embodiment of the packaging arrangement 200 that does not include the heat sink 218, and therefore, does not include the heat transfer compound 220, and also does not include the underfill material 216 between the second die 208 and the die arrangement 202.

Figure 3A:
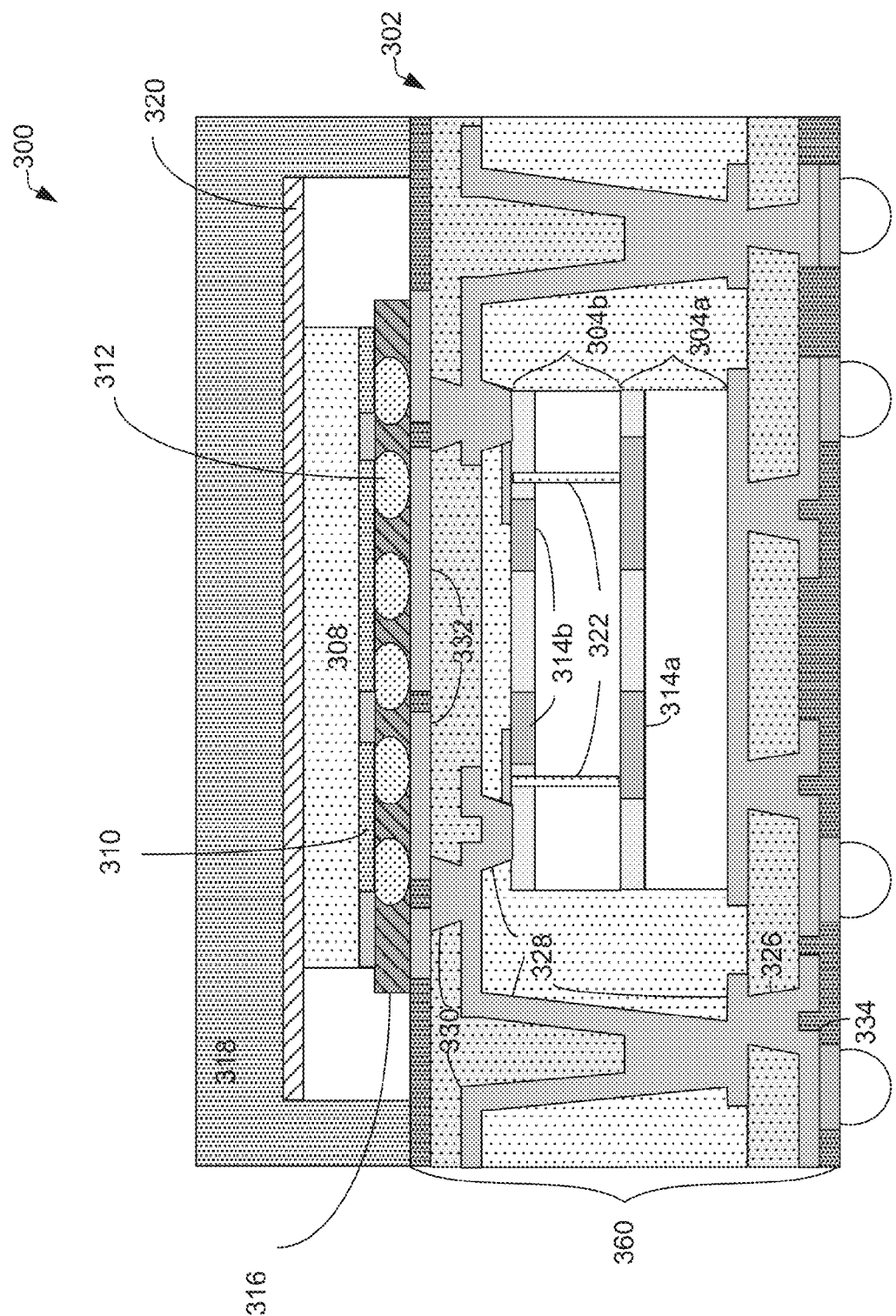
FIG. 3A schematically illustrates another example packaging arrangement that includes another example die arrangement including two dies embedded in a substrate.

FIG. 3A illustrates a packaging arrangement 300 that is similar to packaging arrangements 100 and 200. The packaging arrangement 300 includes two first dies 304a, 304b embedded within a die arrangement 302 that is similar to die arrangements 102 and 202. As can be seen in FIG. 3A, the two first dies 304a, 304b are embedded within the die arrangement 302 in a stacked arrangement, as opposed to a side-by-side arrangement. In accordance with various embodiments, the first dies 304a, 304b are memory devices and, in accordance with an embodiment, the first dies 304a, 304b are dynamic random access memory (DRAM). However, other types of memory devices may be utilized.

The two first dies 304a, 304b are generally combined into a single device utilizing a through substrate via (TSV) arrangement and then embedded within a substrate 306. The two first dies 304a, 304b each include a bond pad 314a, 314b, respectively. Through vias 322 are provided for first the 304a.

A second die 308 is coupled to the die arrangement 302. The second die 308 includes a bond pad 310. The second die 308 is coupled to the die arrangement 302 via solder balls 312 such that the bond pad 310 of the second die 308 is communicatively coupled with the bond pad 314b of the first die 304b via routing structures 328, 330 and 332. The second die 308 is also coupled to the die arrangement 302 via solder balls 312 such that the bond pad 310 is coupled with the through vias 322 via routing structures 328, 330 and 332 and thus, communicatively coupled with the bond pad 314a of the first die 304a. Thus, electrical signals can he routed between the first dies 304a, 304b and the second die 308. The second die 308 is also coupled to the die arrangement 302 via the solder balls 312 such that the bond pad 310 is communicatively coupled with routing structures 326 and 334 via routing structures 328, 330 and 332 to route electrical signals to devices external to packaging arrangement 300. In accordance with various embodiments, the second die 308 is configured to include one or more System-on-Chips (SoCs).

FIG. 3A illustrates the arrangement including underfill material 316 between the second die 308 and the die arrangement 302. However, as with other embodiments described herein, the underfill material 316 may be eliminated if desired. Likewise, while FIG. 3A illustrates the packaging arrangement 300 including a heat sink 318 and heat transfer compound 320, the heat sink 318 and heat transfer compound 320 may be eliminated, as previously described herein with respect to other embodiments, if desired.

Figure 3B:
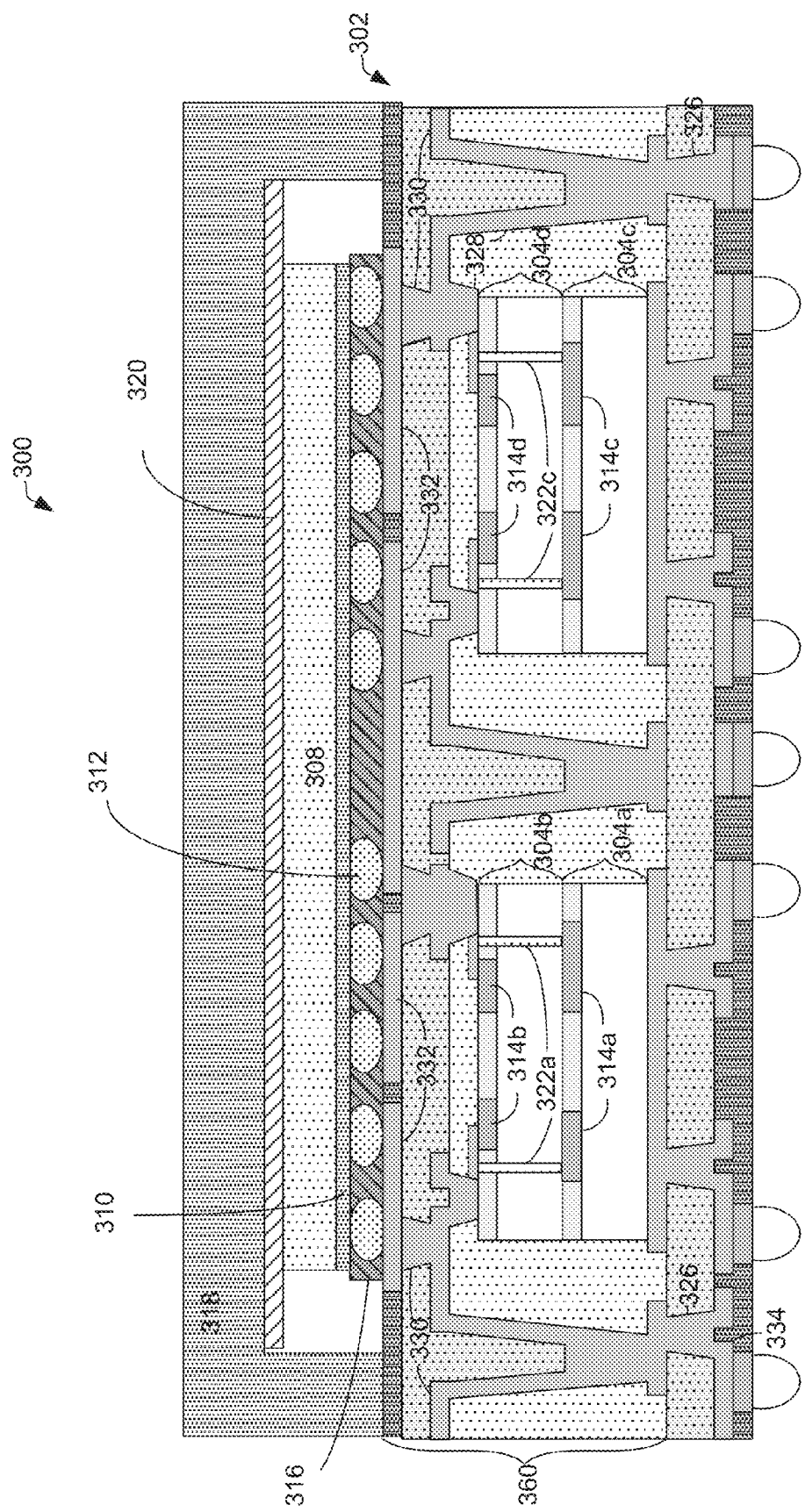
FIG. 3B schematically illustrates another example packaging arrangement that includes another example die arrangement including four dies embedded in a substrate.

FIG. 3B illustrates a packaging arrangement 300 that includes a die arrangement 302 that includes four first dies 304a-d. Two of the first dies 304a, b are arranged in a stacked relationship, while the other two first dies 304c, 304d are also arranged in a stacked relationship. In accordance with various embodiments, the first dies 304a-d are memory devices and, in accordance with an embodiment, the first dies 304a-d are dynamic random access memory (DRAM). However, other types of memo devices may be utilized.

Two first dies 304a, 304b are generally combined into a single device utilizing a TSV arrangement and then embedded within a substrate 306. The two first dies 304a, 304b each include a bond pad 314a, 314b, respectively. Through vias 322a are provided for the first die 304a. The other two first dies 304c, 304d are generally combined into a single device utilizing a TSV arrangement and then embedded within the substrate 306. The two first dies 304c, 304d each include a bond pad 314c, 314d, respectively. Through vias 322c are provided for the first die 304c.

A second die 308 is coupled to the die arrangement 302. The second die 308 includes a bond pad 310. The second die 308 is coupled to the die arrangement 302 via solder balls 312 such that the bond pad 310 of the second die 308 is communicatively coupled with the bond pad 314b of the first die 304b and the bond pad 314d of the first die 314d via routing structures 328, 330 and 332. The second die 308 is also coupled to the die arrangement 302 via solder balls 312 such that the bond pad 310 is coupled with the through vias 320a via routing structures 328, 330 and 332 and thus, communicatively coupled with the bond pad 314a of the first die 304a. The second die 308 is also coupled to the die arrangement 302 via solder balls 312 such that the bond pad 310 is coupled with the through vias 320b via routing structures 328, 330 and 332 and thus, communicatively coupled with the bond pad 314c of the first die 304c. Thus, electrical signals can be routed between the first dies 304a-d and the second die 308. The second die 308 is also coupled to the die arrangement 302 via the solder balls 312 such that the bond pad 310 is communicatively coupled with routing structures 326 and 334 via routing structures 328, 330 and 332 to route electrical signals to devices external to packaging arrangement 300. In accordance with various embodiments, the second die 308 is configured to include one or more System-on-Chips (SoCs).

FIG. 3B illustrates the arrangement including underfill material 316 between the second die 308 and the die arrangement 302. However, as with other embodiments described herein, the underfill material 316 may be eliminated if desired. Likewise, while FIG. 3B illustrates the packaging arrangement 300 including a heat sink 318 and heat transfer compound 320, the heat sink 318 and heat transfer compound 320 may be eliminated, as previously described herein with respect to other embodiments, if desired.

Figure 4:
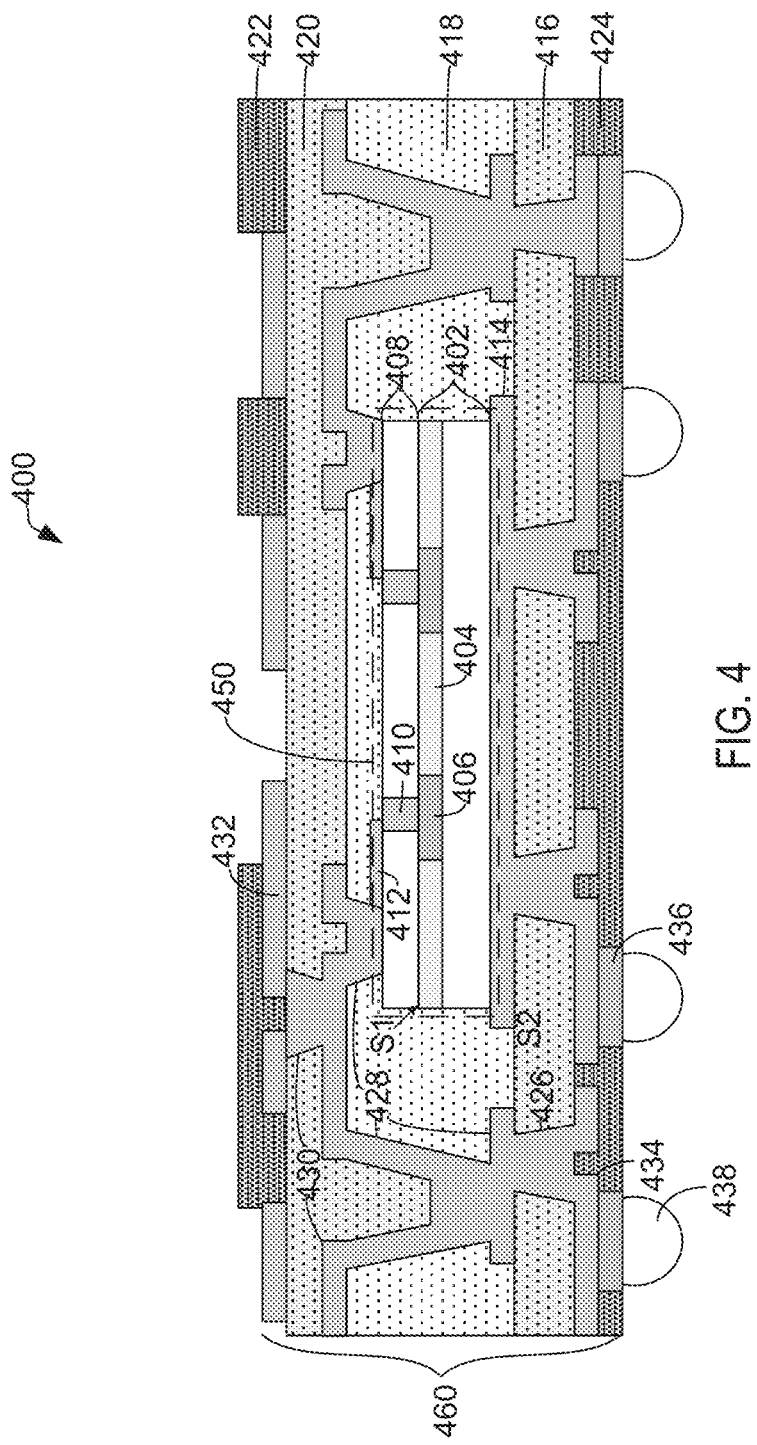
FIG. 4 schematically illustrates an example die arrangement including a die embedded in a substrate.

FIG. 4 schematically illustrates an example die arrangement 400 that includes a die 402 embedded in a substrate 460. The die arrangement 400 can he utilized to implement die arrangement 102, 202 and 302 previously described herein with respect to FIGS. 1A-D, 2A-D and 3A-B.

The substrate 460 includes a first laminate layer 416, a second laminate layer 420, and a core material 418 disposed between the first laminate layer 416 and the second laminate layer 420. The first laminate layer 116 and/or the second laminate layer 420 can include a laminate material such as, for example, epoxy/resin based materials. In some embodiments, the laminate material includes Flame Retardant 4 (FR4) or Bismaleimide-Triazine (BT). The core material 418 can include, for example, a resin. In some embodiments, the core material 418 includes a stage B/C thermosetting resin. The materials are not limited to these examples and other suitable materials for the first laminate layer 416, the second laminate layer 420, and/or the core material 418 can be used in other embodiments.

The substrate 460 further includes a first solder mask layer 424 coupled to the first laminate layer 416 and a second solder mask layer 422 coupled to the second laminate layer 420, as shown. The first solder mask layer 424 and the second solder mask layer 422 generally comprise a solder resist material such as, for example, an epoxy. Other suitable materials can be used to fabricate the first solder task layer 424 and the second solder mask layer 422 in other embodiments.

The substrate 460 further includes routing structures 426, 428, 430, 432, and 434 respectively disposed in the first laminate layer 416, the core material 418, the second laminate layer 420, the second solder mask layer 422, and the first solder mask layer 424. The routing structures 426, 428, 430, 432, and 434 generally comprise an electrically conductive material, e.g., copper, to route electrical signals of the die 402. The electrical signals of the die 102 can include, for example, input/output (I/O) signals and/or power/ground for integrated circuit (IC) devices (not shown) formed on the die 402.

As shown, the routing structures 426, 428, 430, 432, and 434 can include line-type structures to route the electrical signals within a layer of the substrate 460 and/or via-type structures to route the electrical signals through a layer of the substrate 460. The routing structures 426, 428, 430, 432, and 434 can include other configurations than depicted in other embodiments. While a particular configuration has been described and shown for the substrate 460, other substrates that use three-dimensional (3D) packaging methods to embed one or more dies can benefit from the principles described herein.

While not illustrated in the embodiments of FIGS. 1A-D, 2A-D and 3A-B, the die arrangement 400 (and thus, the die arrangements 102, 202 and 302) can include one or more interposers 408. The die 402 and the interposer 408 are embedded in the substrate 460, as shown in FIG. 4, According to various embodiments, the die 402 and the interposer 408 are embedded in the core material 418 between the first laminate layer 416 and the second laminate layer 420. In accordance with various embodiments, the interposer 408 can be formed by redistribution line (RDL) patterning as opposed to being embedded within the substrate 460. Other layers and/or structures within substrate 460 can also be created by RDL patterning.

The die 402 comprises a semiconductor material, such as silicon, and generally includes IC devices (not shown), such as transistors for logic and/or memory or other circuitry, formed on an active side S1. of the die 402. An inactive side S2 of the die 402 is disposed opposite to the active side S1 of the die 402. The active side S1 and the inactive side S2 generally refer to opposing surfaces of the die 402 to facilitate the description of various configurations described herein and are not intended to be limited to a particular structure of the die 402.

In some embodiments, a surface on the inactive side S2 of the die 402 is attached to the first laminate layer 416 using an adhesive 414 such as, for example, a resin. The die 402 can be coupled to the first laminate layer 416 using other techniques, such as using a carrier group, in other embodiments.

The active side S1 of the die 402 has a surface comprising a dielectric material 404. In some embodiments, the dielectric material 404 includes a low-k dielectric material having a dielectric constant that is smaller than a dielectric constant of silicon dioxide. Low-k dielectric materials, such as those that are used to fabricate dies that include features having a size of about 40 nanometers or less, may generally have material properties that are more susceptible to structural defects from process-related stresses than non-low-k dielectric materials. According to various embodiments, the dielectric material 404 includes silicon dioxide doped with materials such as carbon or fluorine. The dielectric material 404 can include other low-k dielectric materials in other embodiments.

The surface on the active side S1 of the die 402 further comprises one or more bond pads 406 or analogous structures to route the electrical signals of the die 402. The one or more bond pads 406 generally comprise an electrically conductive material such as, for example, aluminum or copper. Other suitable materials can be used in other embodiments.

The interposer 408 is coupled to the surface of the die 402 (e.g., on e active side S1) having the dielectric material 404 and the one or more bond pads 406, as shown. The interposer 408 generally includes one or more vias 410 formed in a semiconductor material such as silicon. In some embodiments, the one or more vias 410 include through-silicon vias (TSVs), which pass completely through the interposer 408, as shown. The one or more vias 410 are electrically coupled to the one or more bond pads 406 and are generally filled with an electrically conductive material, e.g., copper, to further route the electrical signals of the die 402.

The interposer 408 can be bonded to the die 402 using, for example, a thermal compression process or solder reflow process. In some embodiments, a metal or solder material that is coupled to the one or more vias 408 is bonded to a metal or solder material disposed on the active side S1 of the die 402. For example, thermal compression can be used to form a metal-metal bond between the interposer 408 and the die 402 such as, for example, copper-to-copper, gold-to-copper, or gold-to-gold. Solder reflow can be used to form a solder bond such as, for example, solder-to-solder or solder-to-metal. A variety of structures can be used to form the bond such as, for example, bumps, pillars, and pads (e.g., the one or more bond pads 406) including redistribution layer (RDL) pad configurations. Other suitable materials, structures, and/or bonding techniques can be used in other embodiments.

In some embodiments, the die 402 and the interposer 408 both comprise a material (e.g., silicon) having the same or similar coefficient of thermal expansion (CTE). Using a material having the same or similar CTE for the die 402 and the interposer 408 reduces stress associated with heating and/or cooling mismatch of the materials.

According to various embodiments, the interposer 408 is configured to protect the dielectric material 404 of the die 402 from cracking or other defects associated with embedding the die 402 in the substrate 460. For example, the formation of one or more layers (e.g., deposition of the core material 418) to embed the die 402 in the substrate 460 can produce stresses that cause structural defects in the dielectric material 404 of the die. The interposer 408 provides a physical buffer, support, and strengthening agent to the die 402 (e.g., the dielectric material 404), particularly during the formation of the one or more layers to embed the die 402 in the substrate 460. That is, the die 402 coupled to the interposer 408 as described herein provides a protected integrated circuit structure 450 that is more structurally resilient to stresses associated with fabricating the substrate 460 than the die 402 alone, resulting in improved yield and reliability of the die 402. Although embodiments have been generally described in connection with the substrate 460 shown in FIG. 4, other substrate configurations that benefit from these principles are included in the scope of the present disclosure.

The routing structures 426, 428, 430, 432, and 434 are electrically coupled to the one or more vias 410 to further route the electrical signals of the die 402 throughout the substrate 460. For example, the one or more vias 410 can be electrically coupled to the routing structures 428 that are disposed in a region of the core material 418 using a fan-out, fan-in, or straight-up connection. In some embodiments, a redistribution layer 412 comprising an electrically conductive material, e.g., copper, is formed on the interposer 408 to route the electrical signals between the one or more vias 410 and the routing structures 428. The routing structures 426, 428, 430, 432, and 434 can he used to provide electrical connections for the electrical signals of the die 402 on opposing surfaces of the substrate 460, as shown.

Additional structures can be formed to further route the electrical signals of the die 402. For example, one or more bond pads 436 can be formed on a surface of the substrate 460. In the depicted embodiment, the one or more bond pads 436 are disposed in the first solder mask layer 424 and electrically coupled to the one or more vias 410. Although not depicted, one or more bond pads can be formed in the second solder mask layer 422 in other embodiments. The one or more bond pads 436 generally comprise an electrically conductive material such as copper or aluminum. Other electrically conductive materials can be used to form the one or more bond pads 436 in other embodiments.

In some embodiments, one or more solder balls 438 or analogous package interconnect structures are formed on e one or more bond pads 436 to facilitate electrical coupling of the die arrangement 400 with other electrical components, e.g., a printed circuit board such as a motherboard. According to various embodiments, the die arrangement 400 is a ball-grid array (BGA) package. The die arrangement 400 can include other types of packages in other embodiments.

Figure 5:
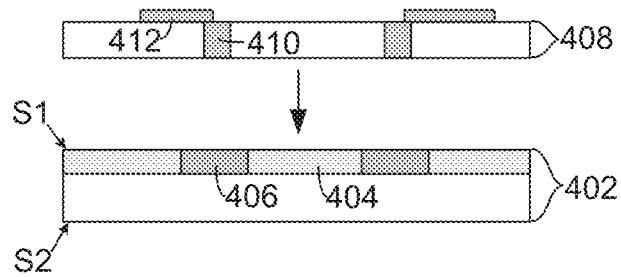
FIG. 5 schematically illustrates a die and an interposer prior to being coupled together.

FIG. 5 schematically illustrates a die 402 and an interposer 408 prior to being coupled together. The die 402 and the interposer 408 may comport with embodiments already described in connection with FIG. 4.

The die 402 can he fabricated using well-known semiconductor manufacturing techniques. For example, the die 402 can be formed on a wafer with multiple other dies where one or more IC devices (not shown), such as transistors, are formed on the active side S1 of the die 402. The dielectric material 404 and the one or more bond pads 406 are generally formed on a surface on the active side S1 of the die 402. The wafer can be singulated to provide the die 402 in singulated form.

The interposer 408 can likewise be fabricated using well-known semiconductor manufacturing techniques. Similar to the die 402, the interposer 408 can be formed on a wafer with multiple other interposers. One or more vias 410 such as, TSVs, can be formed through the interposer 408 and/or a redistribution layer 412 can be formed on a surface of the interposer 408. The wafer can be singulated to provide the interposer 408 in singulated form.

The die 402 and the interposer 408 can be bonded together in singulated or wafer form, or combinations thereof, according to a variety of techniques. For example, the interposer 408 can he singulated and bonded to the die 402 in wafer form, or vice versa.

According to various embodiments, the interposer 408 is bonded to the die 402 using a thermal compression process or a solder reflow process as described herein. That is, one or more electrically conductive structures (e.g., pillars, bumps, pads, redistribution layer) are formed on the interposer 408 and the die 402 to form a bond between the interposer 408 and the die 402. The one or more bond pads 406 of the die 402 can be electrically coupled to the one or more vias 410 of the interposer 408 using any suitable thermal compression process or solder reflow process to form a bond between the one or more electrically conductive structures. The interposer 408 is bonded to the surface of the die 402 (e.g., on the active side S1) having the dielectric material 404 and the one or more bond pads 406 disposed thereon, as indicated by the arrow.

Figure 6:
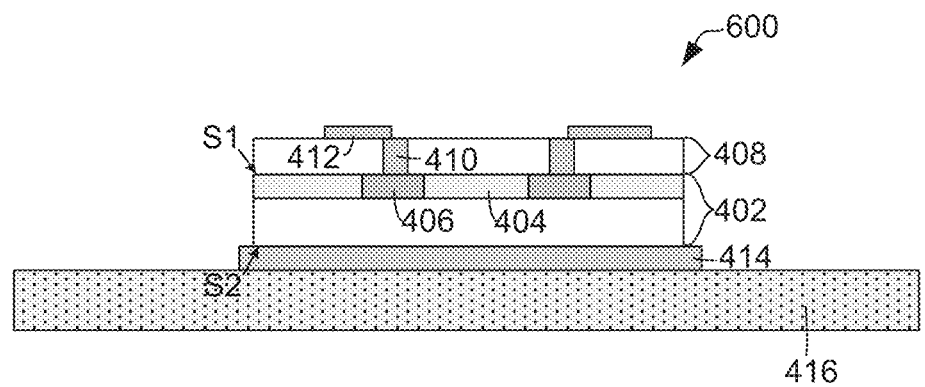
FIG. 6 schematically illustrates a die arrangement subsequent o attaching a die and an interposer to a layer of a substrate.

FIG. 6 schematically illustrates a die arrangement 600 subsequent to attaching a die 402 and an interposer 408 to a layer of a substrate (e.g., the substrate 460 of FIG. 4). In some embodiments, the layer of the substrate is a first laminate layer 416. The first laminate layer 416 may comport with embodiments already described in connection with FIG. 4.

The die 402 can be attached to the first laminate layer 416 using an adhesive 414 to couple the inactive side S2 of the die 402 to the first laminate layer 416. The adhesive 414 may comport with embodiments already described in connection with FIG. 4. The die 402 can be attached to the layer of the substrate using other techniques (e.g., a carrier group) in other embodiments.

Figure 7:
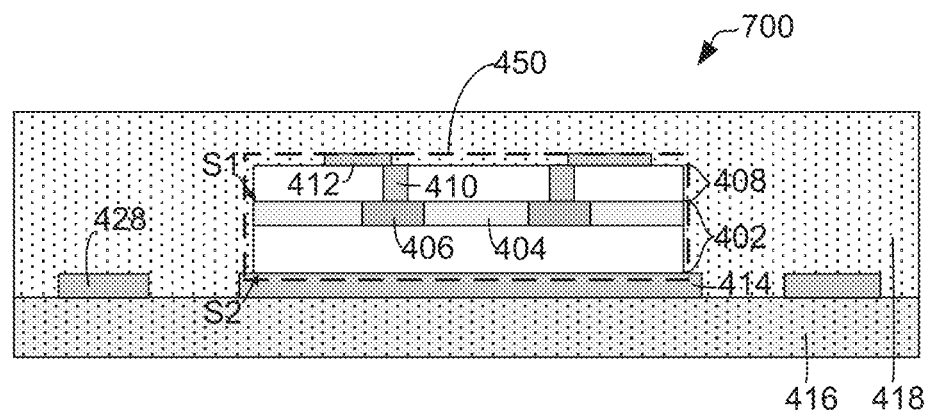
FIGS. 7-11 schematically illustrate a die arrangement subsequent to forming one or more additional layers of the substrate to embed the die in the substrate.

FIGS. 7-11 schematically illustrate a die arrangement subsequent to forming one or more additional layers of the substrate to embed the die in the substrate. Die arrangement 700 of FIG. 7 represents the die arrangement 600 of FIG. 6 subsequent to forming a core material 418 of the substrate (e.g., the substrate 460 of FIG. 4). The core material 418 may comport with embodiments already described in connection with FIG. 4.

The core material 418 can be deposited to encapsulate the die 402 and the interposer 408 as shown. For example, the core material 418 can be formed by depositing a thermosetting resin into a mold.

According to some embodiments, the interposer 408 is disposed to protect the dielectric material 404 of the die 402 from stress associated with deposition of the core material 418. The interposer 408 on the die 402 forms a protected IC structure 450 as described in connection with FIG. 4.

In some embodiments, routing structures 428 are formed on the first laminate layer 416 prior to depositing the core material 418. The routing structures 428 can be formed on the first laminate layer 416 prior to attaching the die 402 to the first laminate layer 416. The routing structures 428 may comport with embodiments already described in connection with FIG. 4.

Figure 8:
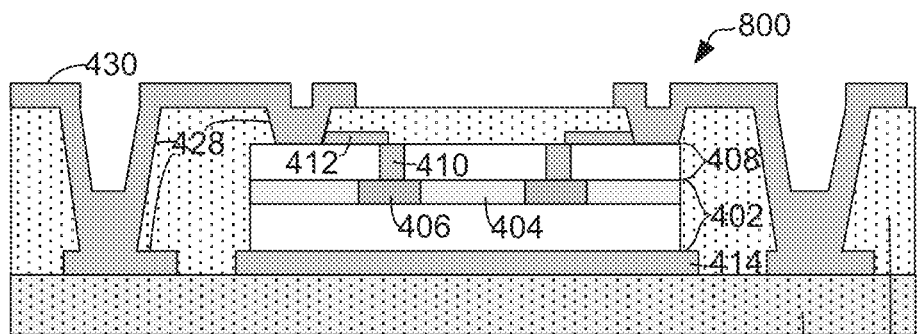

Die arrangement 800 of FIG. 8 represents the die arrangement 700 of FIG. 7 subsequent to patterning the core material 418 and forming additional routing structures 428, as shown, and routing structures 430. The routing structures 430 may comport with embodiments already described in connection with FIG. 4.

The core material 418 can be patterned using any suitable process, e.g., lithography/etch or laser-drilling, to remove portions of the core material 418. Portions of the core material 418 are removed to allow deposition of an electrically conductive material to form the routing structures 428,430. For example, the core material 418 can be patterned to facilitate formation of an electrical connection with the one or more vias 410 of the interposer 408 through the core material 418. The electrical connection can be formed, for example, by depositing an electrically conductive material to form the routing structures 428, 430 that are electrically coupled to the one or more vias 410 through the redistribution layer 412, as shown.

Figure 9:
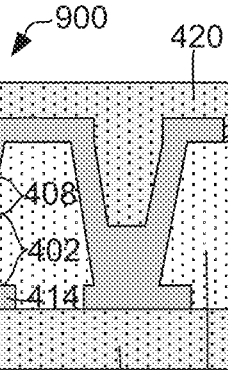

Die arrangement 900 of FIG. 9 represents the die arrangement 800 subsequent to forming a second laminate layer 420 on the core material 418. The second laminate layer 420 may comport with embodiments already described in connection with FIG. 4.

The second laminate layer 420 can be formed by depositing a laminate material on the core material 418 and patterning the laminate material to facilitate formation of an electrical connection with the one or more vias 410 of the interposer 408 through the laminate material. For example, an electrically conductive material can be deposited into the patterned areas of the second laminate layer 420 where the laminate material has been removed to form additional routing structures 430, as shown. The routing structures 430 provide an electrical connection to the one or more vias 410 through the second laminate layer 420.

Figure 10:
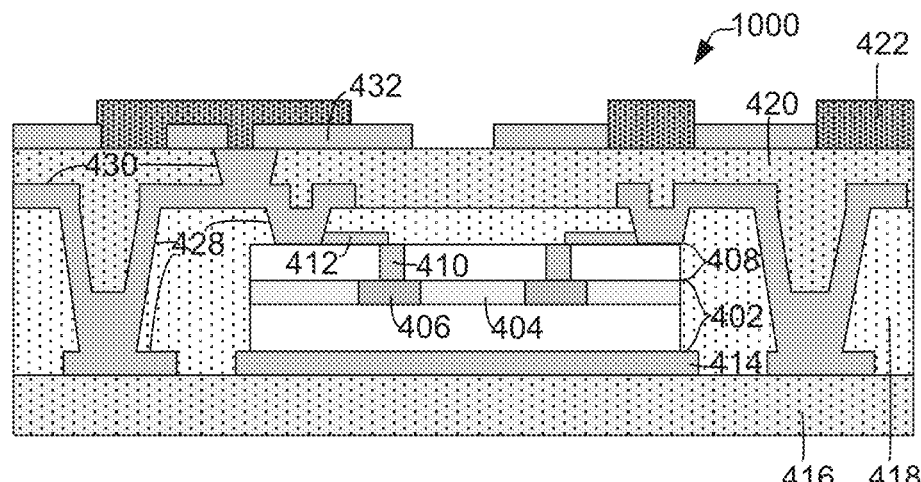

Die arrangement 1000 of FIG. 10 represents the die arrangement 900 subsequent to forming a solder mask layer (e.g., the second solder mask layer 422 of FIG. 4) on the second laminate layer 420. The second solder mask layer 422 may comport with embodiments described in connection with FIG. 4.

Routing structures 432 can be formed by deposition and/or patterning of an electrically conductive material on the second laminate layer 420. The routing structures 432 may comport with embodiments described in connection with FIG. 4. A solder resist material can be deposited and/or patterned to form the second solder mask layer 422. The solder resist material can be formed such that some of the routing structures 432 are exposed for further electrical connection.

Figure 11:
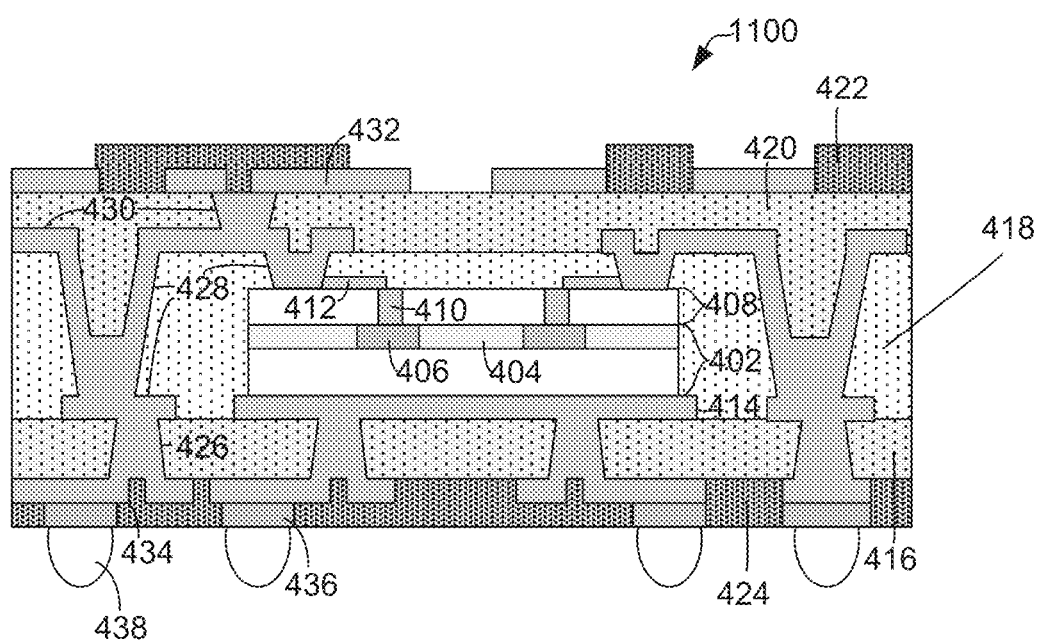

Die arrangement 1100 of FIG. 11 represents the die arrangement 1000 subsequent to forming routing structures 426 in the first laminate layer 416 and subsequent to forming a solder mask layer (e.g., the first solder mask layer 424 of FIG. 4) on the first laminate layer 416. The first solder mask layer 424, one or more bond pads 436, one or more solder balls 438, and routing structures 426, 434 may comport with embodiments described in connection with FIG. 4.

In some embodiments, the first laminate layer 416 is patterned to facilitate formation of an electrical connection with the one or more vias 410 of the interposer 408 through the first laminate layer 416. An electrically conductive material can be deposited into the patterned portions of the first laminate layer to form the routing structures 426 that provide the electrical connection with the one or more vias 410.

The routing structures 434 are formed on the first laminate layer 416 and electrically coupled to the routing structures 426 to route the electrical signals of the die 402. The one or more bond pads 436 are formed on the routing structures 426. A solder resist material is deposited and/or patterned to form the solder mask layer 424. Openings may be formed in the solder resist material to allow formation/placement of solder balls 438 on the one or more bond pads 434.

The packaging arrangements 100, 200 and 300 as described herein generally can have a thickness of approximately 1.2 millimeters. Furthermore, the separation of the second die 108, 208 and 308 (configured with one or more SoCs) and the first die(s) 104, 204a,b and 304a-d (when in the form of memory) results in less heat from the second die affecting the performance of the first die(s). The heat sink 118, 218 and 318, as well as the heat transfer compound 120, 220 and 320, also help keep heat from the second die affecting the performance of the first die(s).

Figure 12:
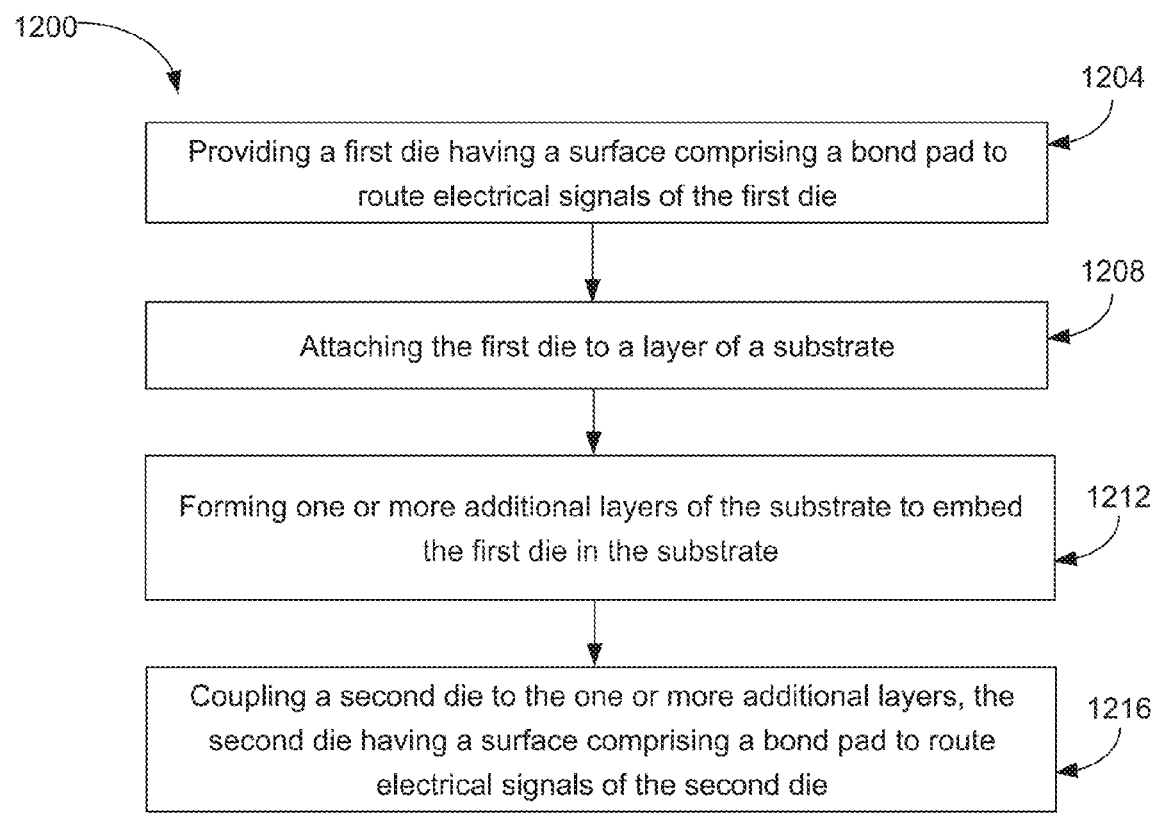
FIG. 12 is a process flow diagram of a method to fabricate a package arrangement described herein.

FIG. 12 illustrates an example method 1200, in accordance with an embodiment of the present disclosure. At 1204, a first die is provided such that the first die has a surface comprising a bond pad to route electrical signals of the first die. At 1208, the first die is attached to a layer of a substrate. At 1212, one or more additional layers of the substrate are formed to embed the first die in the substrate. At 1216, a second die is coupled to the one or more additional layers, where the second die has a surface comprising a bond pad to route electrical signals of the second die. In an embodiment, the second die is coupled to the one or more additional layers such that electrical signals are routed between the first die and the second die.

The description may use perspective-based descriptions such as up/down, over/under, and/or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

The terms chip, integrated circuit, monolithic device, semiconductor device, die, and microelectronic device are often used interchangeably in the microelectronics field. The present invention is applicable to all of the above as they are generally understood in the field.

Although certain embodiments have been illustrated a id described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein, Therefore, it is manifestly intended that embodiments described herein be limited only by the claims and the equivalents thereof.

What is claimed is:

1. An apparatus comprising:
a substrate having (i) a first laminate layer, (ii) a second laminate layer, and (iii) a core material that is disposed between the first laminate layer and the second laminate layer;
a first die having a first surface that is coupled to the first laminate layer, the first die having a second surface that is opposite to the first surface of the first die, wherein the second surface of the first die comprises a bond pad to route electrical signals of the first die, and wherein the first die is embedded in the core material of the substrate such that the core material separates at least a section of the second surface of the first die from the second laminate; and
a second die coupled to the second laminate layer, the second die having a surface comprising a bond pad to route electrical signals of the second die,
wherein the second die is coupled to the second laminate layer such that electrical signals are routed between the first die and the second die.

2. The apparatus of claim 1, wherein the second die is coupled to the second laminate layer via solder balls.

3. The apparatus of claim 2, further comprising:
underfill material between the second die and the second laminate layer.

4. The apparatus of claim 1, further comprising:
a heat sink coupled to the second die,
wherein the second die is coupled to the second laminate layer at a first surface of the second die, and
wherein the heat sink is coupled to the second die at a second surface of the second die that is opposite to the first surface of the second die.

5. The apparatus of claim 4, wherein the second die is coupled to the second laminate layer via solder balls.

6. The apparatus of claim 5, further comprising:
underfill material between the second die and the second laminate layer.

7. The apparatus of claim 1, further comprising:
a third die coupled to the first laminate layer, the third die including a surface comprising a bond pad to route electrical signals of the third die,
wherein the third die is embedded in the core material of the substrate, and
wherein the second die is coupled to the second laminate layer such that electrical signals are routed between the third die and the second die.

8. The apparatus of claim 7, wherein the third die is positioned in one of either (i) a substantially side-by-side arrangement with respect to the first die or (ii) a substantially stacked arrangement with respect to the first die.

9. The apparatus of claim 7, further comprising:
a fourth die coupled to the first laminate layer, the fourth die including a surface comprising a bond pad to route electrical signals of the fourth die, wherein the fourth die is embedded in the core material of the substrate; and
a fifth die coupled to the first laminate layer, the fifth die including a surface comprising a bond pad to route electrical signals of the fifth die, wherein the fifth die is embedded in the core material of the substrate,
wherein the third die is positioned over the first die such that the third die and the first die are in a substantially stacked arrangement,
wherein the fifth die is positioned over the fourth die such that the fifth die and the fourth die are in a substantially stacked arrangement,
wherein the first and third dies and the fourth and fifth dies are arranged in a substantially side-by-side arrangement,
wherein the second die is coupled to the second laminate layer such that electrical signals are routed between the fourth die and the second die, and
wherein the second die is coupled to the second laminate layer such that electrical signals are routed between the fifth die and the second die.

10. The apparatus of claim 1, wherein the first die is a memory device and the second die is an integrated circuit configured to include one or more Systems-on-Chip (SoCs).

11. The apparatus of claim 1, wherein the second die is not embedded in the core material of the substrate.

12. The apparatus of claim 1, wherein the first laminate layer and the second laminate layer comprises laminate material.

13. The apparatus of claim 12, wherein the laminate material comprises one of epoxy/resin based materials, Flame Retardant 4 (FR4) or Bismaleimide-Triazine (BT).

* * * * *